United States Patent [19]

Gumienny

[11] 4,379,098

[45] Apr. 5, 1983

[54] ELECTROMAGNETIC RADIATION SHIELDING COMPOSITES AND METHOD OF PRODUCTION THEREOF

[75] Inventor: Anthony Gumienny, Columbus, Ohio

[73] Assignee: Transmet Corporation, Columbus, Ohio

[21] Appl. No.: 169,671

[22] Filed: Jul. 17, 1980

[51] Int. Cl.³ .................... H05B 6/60; H02M 3/04
[52] U.S. Cl. ..................... 264/24; 264/27; 264/104; 264/105; 264/DIG. 45
[58] Field of Search ............ 264/24, 25–27, 264/22, 104, 105, DIG. 45

[56] References Cited

U.S. PATENT DOCUMENTS

| | | |
|---|---|---|
| 2,321,587 | 6/1943 | Davie et al. |
| 2,406,714 | 8/1946 | Strickland, Jr. ............ 264/26 |
| 3,194,860 | 7/1965 | Ehrreich ............ 264/104 |
| 3,393,257 | 7/1968 | Cable ............ 264/27 |
| 4,216,423 | 8/1980 | Davenport ............ 320/1 |
| 4,227,037 | 10/1980 | Layton ............ 264/105 |
| 4,243,460 | 1/1981 | Nagler ............ 264/22 |

OTHER PUBLICATIONS

Gul, V. E. et al., "Microbreakdown Effect of Polymers with a Dispersed Conducting Filler", Doklady Akademii Nauk SSSR, vol. 194, No. 3, pp. 632–634, Sep., 1970.

Gul, V. E., "Effect of the Structure of Electrically Conducting Polymer Compositions on Their Properties Review", Vysokomol Soyed, vol. 20, No. 10, pp. 2163–2174, 1978.

Primary Examiner—Jeffery R. Thurlow
Attorney, Agent, or Firm—Burns, Doane, Swecker & Mathis

[57] ABSTRACT

A method is disclosed for the preparation of an electromagnetic shielding composite which exhibits high conductivity and low resistance. The method comprises applying an electrical potential difference across a composite comprised of an electrically conductive material dispersed within a matrix material to increase the conductivity of the composite. An electrical current of sufficient magnitude is then passed through the composite to further increase the conductivity of the composite while maintaining the electrical potential difference at a value which does not exceed the value of the electrical potential difference which was previously applied.

39 Claims, 2 Drawing Figures

ELECTROMAGNETIC RADIATION SHIELDING COMPOSITES AND METHOD OF PRODUCTION THEREOF

BACKGROUND OF THE INVENTION

The present invention relates to electromagnetic radiation shielding composites which exhibit high conductivity and low resistance.

As technology progresses and produces more sophisticated electronic equipment, the environment becomes more polluted with electromagnetic (EM) radiation. This radiation has recently become recognized as constituting a significant hazard to the health of individuals as well as to the operation of electronic equipment, and in particular, to digital equipment that is generally more easily adversely affected by spurious radiation. There is therefore a need to control such random and undirected radiated electromagnetic energy while also shielding the environment (including both biological life and equipment) from its effects.

The shielding of both emitted radiation and incoming radiation has traditionally been done by metallic enclosures. Metal serves as a shield as a result of its high conductivity due to the fact that the penetration of EM radiation is dependent upon the conductivity exhibited by the shield. In fact, continuous metal enclosures having a thickness in the range of 1/32 inch to 1/10 inch serve as effective shields for EM radiation over the radio-frequency band from the kilohertz to gigahertz range. The most common metallic enclosures are comprised of steel, aluminum and copper. However, such metallic shielding enclosures are unfortunately both heavy and costly.

As an alternative, equipment has been enclosed in plastic structures consisting of polymeric moulding compounds which have dispersed therein conductive materials such as metallic fibers, carbon fibers, etc. See for example, U.S. Pat. No. 3,996,167, issued to Brown. Composites have also been modified to produce higher conductivity by the use of surface treatments such as conductive paints, spray plating, flame spraying, or vacuum metallizing. See, for example, U.S. Pat. No. 2,321,587, issued to Davie et al. However, these techniques often either prove to be too costly or do not sufficiently increase the conductivity of the structure to provide the desired amount of shielding.

Due to the flexibility of design provided by utilizing molded plastic parts as shielding composites, it is desirable to provide adequate electromagnetic shielding by incorporating metallic or other conductive materials (e.g., in flake or fiber form) into the polymeric matrix to eliminate the use of secondary coating operations. A further advantage of integrally incorporated particles is that control of the passage of electromagnetic waves is achieved by absorption as well as by reflection because of the bulk conductivity created.

However, there is presently a need for an efficient and economical means of providing shielding which exhibits minimal resistance and high conductivity. Due to the fact that only limited amounts of conductive materials can be incorporated into such shielding composites without imparing the ability of the matrix material from which the composite is made to be molded, it is desired to provide a method to increase the conductivity of the composite without having to unnecessarily increase the amount of conductive material employed.

In addition, the use of shielding composites comprised of structural foams is advantageous in certain instances where a lower weight composite is required. The maximum amount of conductive material which the foamed composite can contain may be less than the maximum amount which an unfoamed composite can contain since less effective volume may be available within which to disperse the material.

Therefore, it is desirable to provide a method by which the conductivity of such shielding composites can be increased over and above that exhibited by the composite subsequent to incorporation of the conductive material.

OBJECTS AND SUMMARY OF THE INVENTION

It is therefore an object of the present invention to provide an effective method of providing a shielding composite possessing a high conductivity.

It is also an object of the present invention to provide an effective method of providing a shielding composite which exhibits low resistance.

It is also an object of the present invention to provide an effective method of increasing the conductivity of a foamed shielding composite.

In one aspect of the present invention there is provided a method of preparing an electromagnetic shielding composite which exhibits high conductivity and low resistance comprising:

providing a composite comprising an electrically conductive material dispersed within a matrix material; and applying an electrical potential difference across said composite of sufficient magnitude to increase the conductivity of the composite, and thereafter passing an electrical current through the composite of sufficient magnitude to further increase the conductivity of the composite while maintaining the electrical potential difference at a value which does not exceed the value of the electrical potential difference which was previously applied.

In another aspect of the present invention there is provided a method of preparing an electromagnetic radiation shielding composite which exhibits high conductivity and low resistance comprising:

providing a composite comprising an electrically conductive material dispersed within a matrix material; and applying an electrical potential difference across said composite such that a first and at least one additional electrical potential difference are applied across said composite, each said electrical potential difference being greater than the electrical potential difference which precedes it and each said additional electrical potential difference which is applied being of such a value so as to increase the conductivity of said composite in comparison to that which said composite exhibited prior to applying said additional electrical potential difference, and thereafter passing an electrical current through the composite of sufficient magnitude to further increase the conductivity of the composite while maintaining the electrical potential difference at a value which does not exceed the value of the highest electrical potential difference which was previously applied.

DETAILED DESCRIPTION OF THE INVENTION

Figure 1:
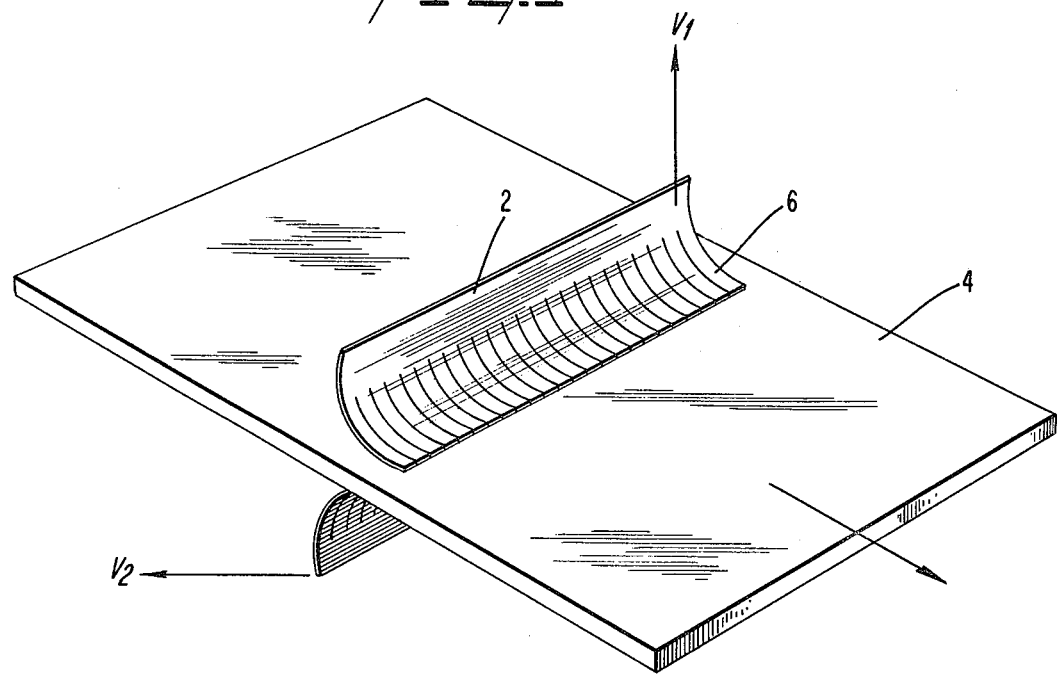
FIG. 1 illustrates a means by which an electrical potential difference may be provided across a shielding composite in accordance with the method of the present invention.

The electromagnetic radiation shielding composite of the present invention may take many forms. The composite is generally employed as a shield for electromagnetic radiation in the form of a three-dimensional composite which is shaped to provide the proper shielding effect. That is, the composite may consist of a sheet-like portion which may be used in conjunction with other sheet-like portions to form a multi-sided structure. Such a structure can be used to enclose equipment which is sensitive to the effects of electromagnetic radiation. Alternatively, the composite may take the form of a structure which is molded in a specific shape (e.g., a hemisphere) or a shape with conforms to the configuration of the equipment to be shielded.

The composite comprises a matrix of non-conductive material within which is dispersed an electrically conductive material. The matrix material serves as a binder or matrix for the electrically conductive material and provides structural integrity for the shielding composite. The matrix material preferably comprises a thermosetting or thermoplastic resinous material within which the conductive material can be dispersed. Suitable materials include but are not limited to addition polymers of aliphatic monoolefins, ethylenically unsaturated carboxylic acids and the esters thereof, monovinylidene aromatic carbocyclic monomers, conjugated dienes and ethylenically unsaturated nitriles, amines, ethers and ketones. Such materials also include polyamides, polyesters, polycarbonates, polyurethane, polystyrene, phenolic resins and silicone rubbers. Thermoplastic materials such as polyethylene, polystyrene and polycarbonate are most preferred. Various types of ceramic materials may also be used as the matrix material. One skilled in the art can readily determine which materials are suitable for use as a matrix material as such materials are conventional and well known in the art.

The method of the present invention finds particular applicability to shielding composites comprising a foamed matrix material within which is dispersed the electrically conductive material. Such a foamed matrix must be sufficiently dense to provide the desired structural integrity for the composite. Generally, the density of the foamed matrix will be between about 70 to 100 percent of the density exhibited by the unfoamed matrix material. The method of manufacture of such structural foams is known and includes the entrainment of a gas such as nitrogen and the use of blowing agents to provide the foamed structure. Suitable structure foams which are commercially available include polycarbonate structural foams denoted as General Electric FL 900 or Mobay FS 600.

Several types of electrically conductive filler materials may be used. For example, the conductive filler material may consist of carbon fibers or finely divided metallic solids comprised of copper, zinc, aluminum, silver, iron, nickel, gold, tungsten, niobium, carbon steel and stainless steel as well as alloys or physical admixtures thereof. Aluminum is the preferred metal for use in the present invention. This listing of suitable conductive materials is not all-inclusive and other types of electrically conductive materials may be used in the present invention.

The conductive material may also consist of non-conductive solids such as resinous or glass particles which have been coated with a conductive material (e.g., by suitable metallizing techniques) to render the solids conductive. Such non-conductive solids are preferably metallized such that the added metal forms a continuous layer on the surface of the nonconductive solid.

The conductive material may be in any suitable form or shape such as flakes, fibers and spherical or non-spherical particles or powders. The conductive material may be of any suitable size but should be of such a size that sufficient quantity of the solids may be dispersed within the matrix material to permit the desired conductivity to be achieved.

Exemplary sizes for metallic flakes may range from about 1 mil in thickness to about 50 by 40 mils in dimension. Exemplary fibers can range up to about 250 mils in length or greater and have a diameter of about 3 mils or greater. Preferably the length of such fibers is about 125 mils.

The methods by which such conductive materials may be admixed with or dispersed within the matrix material are conventional and known to those skilled in the art. For example, the material can be admixed with a thermoplastic polymeric matrix material in a heated state, with the matrix material then being cooled to solidify the matrix and form the composite. The conductive material can be admixed with a thermosetting matrix material in an uncured state, with the matrix material then being cured by suitable means such as by application of heat to form the composite.

The quantity of conductive material which is dispersed within the matrix material will generally range from 5 percent by weight to about 60 percent by weight based on the weight of the composite. Amounts greater than that can be used advantageously. However, difficulty may arise when attempting to admix the conductive material with the matrix material if the amounts of the conductive material which are used are too great. Preferably, the conductive material will be employed in an amount ranging from about 5 to 40 percent by weight to achieve adequate workability of the admixture as well as provide sufficient shielding effectiveness. A most preferred range is about 15 to 30 percent by weight. Generally, however, it has been found that a higher loading volume percent of the electrically conductive material will enable higher conductivity and lower resistance to be achieved both before and after treatment of the composite by the method of the present invention.

The composite which contains the electrically conductive material dispersed throughout a matrix material will naturally exhibit a conductivity value in excess of that which is normally exhibited by the composite in the absence of the electrically conductive material (and, conversely, a lower resistivity). However, in order to both further increase the conductivity and further lower the resistivity exhibited by the composite, it is advantageous to subject the composite to the method of the present invention.

Specifically, the method of the present invention involves providing an electrical potential difference across the shielding composite of sufficient magnitude to increase the conductivity of the composite. Thereafter, an electrical current is passed through the composite to further increase the value of the conductivity while maintaining the value of the electrical potential difference at a value which does not exceed the highest value of the electrical potential difference previously applied. The conductivity of the composite can be increased by several magnitudes as a result of using the method of the invention. Both the dc resistivity and the RF transmission of the composite are similarly changed radically.

The value for the potential difference which is provided to initially obtain an increase in conductivity will vary depending upon the type of matrix material employed as well as the type and amount of electrically conductive material dispersed therein. However, it has been found that providing a potential difference of between about 500 to 15,000 volts will be sufficient to increase the conductivity of the composite.

Generally, the conductivity of a composite comprised of an unfoamed matrix will be increased as a result of providing an electrical potential difference which is lower than that which may be required to provide similar results in a composite comprised of the same foamed matrix material due to the greater inherent resistance of the foamed composite. For example, it is possible that the conductivity of a shielding composite comprised of an unfoamed matrix material may be increased by providing an electrical potential difference of from about 500 to 1000 volts. A similar shielding composite comprised of a foamed matrix material may require an electrical potential of from 6000 to 12,000 volts to provide an increase in conductivity. However, it is not possible to generalize about the magnitude of the electrical potential difference which will be required since it is dependent upon the physical characteristics of the shielding composite.

It should be noted, however, that the potential difference which is applied in an attempt to increase the conductivity of the shielding composite should not be of such a magnitude that the composite will be physically degraded upon application thereof. For example, the resistance of the composite may be so high that the ability of the composite to act as a conductor is exceeded. In such a case, arcing may occur and the composite may become burned or charred.

Such a consequence may be avoided by modifying the method by which the electrical potential difference is provided. That is, an electrical potential difference may be applied across the composite such that a first and at least one additional electrical potential difference are applied across the composite. Each potential difference which is applied is greater than the potential difference which was previously applied across the composite. As each additional potential difference is applied the conductivity of the composite will increase subject to the limitations discussed below.

The electrical potential differences which are provided across the composite may be increased in magnitude a sufficient number of times and to such a final value so that the conductivity exhibited by the composite no longer increases. The number of potential differences which are provided is not critical. Accordingly, the number of potential differences provided may be as few as two or, in the alternative, be much greater than two, such as, for example, ten or more. Satisfactory results can generally be obtained by providing from three to six potential differences across the composite of differing but increasing magnitudes. As will be discussed hereafter, the number of potential differences of differing magnitude which may be employed to produce the desired results depends to a great extent upon the individual magnitude of the potential differences provided.

The increase in magnitude of the electrical potential difference across the composite may be conducted in either a substantially continuous or ramp-like manner or, in the alternative, in a step-wise manner (i.e., the value is increased intermittently). However, electrical potential differences are advantageously provided which are increased over a sufficiently large range of values.

The initial potential difference which is provided preferably is about 500 to 1000 volts. Advantageously, the value of each additional potential difference is from about 25 to 300 percent greater than the value of the potential difference which preceded it. An exemplary and non-limiting progression of values for the potential differences which may be provided is 1000, 3000, 6000, 9000, 12,000 and 15,000 volts.

It will be observed that increasing the potential difference across the composite will result in an increase in conductivity up to a certain point. That is, no further improvement will generally be observed for the conductivity exhibited by the composite after a certain threshold value for the potential difference is reached or exceeded. However, the threshold value generally varies with each matrix material and the amount and type of conductive material dispersed therein, so it is not possible to quantify such a value without some experimentation. However, the threshold value will generally be significantly less for a composite comprised of a matrix material which is not foamed as opposed to a composite comprised of a matrix material which is foamed.

Such a threshold value may be reached by applying either a single electrical potential difference of sufficiently high magnitude or by increasing the electrical potential difference continuously (i.e., in a ramp-like manner) or in a step-wise manner. Once the threshold value is reached, a current of sufficient magnitude is then passed through the composite to obtain an additional increase in conductivity while the electrical potential difference is maintained at a value which is less than or equal to the highest potential difference previously applied.

It has been surprisingly and unexpectedly discovered that while no further increase in conductivity will be observed by increasing the value of the potential difference which is applied once the threshold value is reached, a further increase in conductivity can be achieved by maintaining the electrical potential difference at a value which is less than or equal to the value of the largest potential difference previously applied while passing an electrical current through the composite of sufficient magnitude to further increase the conductivity. The value of the electrical current which is passed through the composite will be greater than the value of any current which previously passed through the composite during the application of the electrical potential difference which was previously applied.

It should be noted that the potential difference which is employed need not be of sufficient magnitude to reach the threshold value. That is, in order to achieve the results of the present invention it is only necessary that the potential difference which is applied across the composite be of sufficient magnitude to increase the conductivity and lower the resistivity of the composite. That is, the electrical potential difference which is applied need only be of sufficient magnitude to break down the insulating barriers between the conductive material so that an increase in conductivity can be observed. Such a potential difference is, in effect, the "break-through" voltage. The value of the potential difference thus need not be sufficiently great to maximize the increase in conductivity, as such can be achieved by subsequently passing an electrical current through the composite as discussed below.

The current which is subsequently passed through the composite is of sufficient magnitude to increase the conductivity of the composite but of insufficient magnitude to physically degrade the composite. Such physical degradation (e.g., charring, burning or melting of the matrix) will generally result in a lowering of the conductivity of the composite and should be avoided.

A single current of sufficient magnitude may be passed through the composite to increase the conductivity thereof so as to enable the composite to serve as an effective shield for electromagnetic radiation. In the alternative, electrical currents of differing but increasing magnitudes may be employed such that the magnitude of the various currents which are passed through the composite are increased either continuously (i.e., in a ramp-like manner) or on a step-wise basis.

The magnitude of the electrical current which is passed through the composite may be selected from a wide range. For example, suitable values for the electrical current may range from about 100 microamps to about 100 milliamps or so. As previously noted, one limitation regarding the magnitude of the electrical current is the ability of the composite to act as a conductor without being physically degraded. However, the magnitude of the electrical current will be greater than the magnitude of any current which passed through the composite during the application of the electrical potential difference which was previously applied.

The electrical potential difference and the electrical current may be provided by many suitable methods. However, they are preferably provided in a direction which is perpendicular to the plane of the shield.

For example, one method of applying the electric potential and the electrical current to the composite is illustrated in FIG. 1 and involves the use of electrodes 2 which are applied to the surface of the composite 4 in the form of phosphor-bronze finger stock such as are used for providing contacts around the periphery of shielded room doors. These electrodes can be applied to both sides of a flat sheet-like composite 4 and high-voltage applied to them to provide a potential difference $V_1 - V_2$. The composite is then passed between the electrodes at a suitable speed. The multiple flexible fingers of metal 6 conform to the surface of the composite and provide the electrical potential difference in a one-dimensional pattern; that is, in line contact.

Once the composite has been passed between the electrodes and an electrical potential difference of suitable magnitude applied, the composite is then again passed between the electrodes and an electrical current passed through the composite while the electrical potential is maintained at a value less than or equal to that previously applied.

Figure 2:
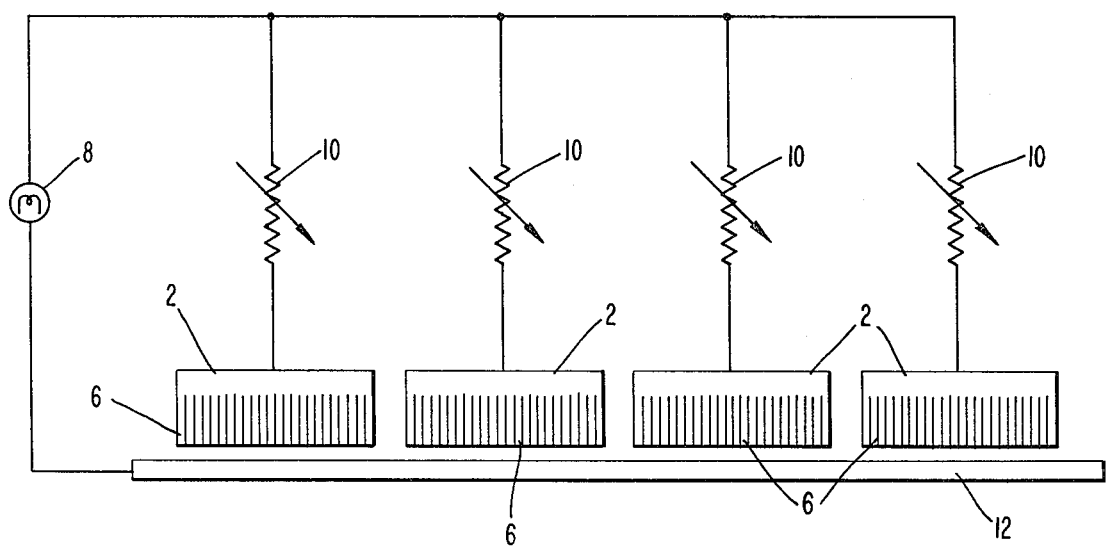
FIG. 2 illustrates an electrical circuit which may be used in the method of the present invention.

FIG. 2 illustrates a schematic of an electrical circuit which may be employed in conjunction with the finger stock electrodes depicted in FIG. 1. The electrodes 2 are connected in parallel to an alternating current source 8 which is adapted to provide a variable voltage output. The current which passes through each electrode may be controlled by a variable resistor 10. Such a circuit enables the magnitude of the electrical potential which is applied across the shielding composite (not shown) as it is passed between the electrodes and a base plate 12 to be controlled as well as the electrical current which is passed through the composite. It should be noted that no base plate is employed in the embodiment shown in FIG. 1 as the electrodes are disposed on both sides of the composite.

Additional types of electrodes may be used instead of the finger stock electrodes which are depicted in the Figures and which are substantially linear in configuration. For example, brush electrodes may also be used to provide contact over a wider area.

The electric potential difference applied to the electrodes can be from various sources and frequencies. For example, a 60-hertz source has been found to be satisfactory. However, a potential difference of any frequency from dc to microwaves will similarly affect the composite, as the mechanism apparently depends upon a breakdown between particles within the composite caused by the electric field.

Another suitable method of providing the electrical potential difference may be advantageous when the composite consists of a three-dimensional object such as a molded box or housing. An electrode is applied to the inner surface by metal foil which is easily conformed to the surface in any shape and the electric field then applied between this electrode and a flexible outer electrode which scans or travels over the surface. The scanning may be done either automatically or by hand in the case of a very intricate shape. The inner electrode may also consist of a conductive liquid (e.g., salt water) if the surface of the part under treatment is leakproof.

A further method of providing the electrical potential difference is by exposure to a microwave field (e.g., in an oven) or by means of an antenna. This method has the significant advantage of being a non-contact application. For example, a flat composite sheet may be passed through a microwave field.

The means by which dc conductivity and RF transmission are changed by use of the method of the present invention is not completely understood. It is believed, however, that the applied electrical potential difference and electrical current causes a breakdown of the insulating film of non-conductive matrix material between the electrically conductive material. A network of conducting paths are believed to be formed in the composite, thus providing a bulk property change from low conductivity to high conductivity. Attempts have been made to observe such conducting paths by both visible microscopy and scanning electron microscopy without success. The hypothesis is, however, strengthened by the fact that the current output of the power source (a high voltage, high internal resistance transformer in most experiments) is continuously varying and has a waveform with high frequency components which suggests the presence of minute arcing within the composite. Surface arcing is also sometimes visible when a composite is passed between electrodes. This surface arcing varies with the amount of incorporated electrically conductive material that is near or at the surface of the shielding composite.

The invention is additionally illustrated in connection with the following Example which is to be considered as illustrative of the present invention. It should be understood, however, that the invention is not limited to the specific details of the Example.

EXAMPLE 1

A composite comprised of a matrix consisting of unfoamed polycarbonate and containing 25 percent by weight of aluminum fibers is subjected to a series of treatments wherein electrical potential differences of increasing magnitude are provided across the composite. The composite is in the form of a sheet of ¼ inch in thickness. The sheet is moved through electrodes which are 1¾ inches wide at a speed of 1 inch every 5 seconds in the manner depicted in FIG. 1. The sheet is passed between the electrodes a number of times with the electrical potential difference being varied each time. The magnitude of the various potential differences employed and the change in resistance of the composite across its smallest dimension (i.e., across its thickness) are set forth in Table I below, with the resistance of the composite subsequent to the application of the potential differences being measured at nine different points along the surface of the composite to take into account possible non-uniformity in the dispersion of the aluminum fibers in the matrix.

The value for the electrical potential difference is then maintained at a value less than or equal to the value of the potential difference in Run D (i.e., the highest potential difference previously employed) while the current which is passed through the composite as it is twice passed between the electrodes is increased to exceed that which passed through the composite in Run D. The resistance of the composite is then remeasured at each point for Runs E and F and the values thereof set forth in Table I. As a review of the data will indicate, the conductivity of the composite after the last Run F has been increased several fold due to the decrease in resistivity exhibited over that exhibited by the composite after previous Run D.

TABLE I

| Run | Potential Difference (volts)[a] | Current (milliamps) | Resistance (Position No., ohms) | | | | | | | | |
|---|---|---|---|---|---|---|---|---|---|---|---|
| | | | 1 | 2 | 3 | 4 | 5 | 6 | 7 | 8 | 9 |
| Control | Untreated | Untreated | 229 | 484 | 940 | 330 | 98 | 29 | 107 | 46 | 39 |
| A | 300 | 0.64 | 52 | 130 | 56 | 89 | 3.4 | 13.4 | 30 | 17 | 53 |
| B | 500 | 1.06 | 40 | 29 | 5.2 | 7.6 | 3.1 | 2.8 | 8.3 | 10.2 | 3.2 |
| C | 750 | 1.60 | 4.9 | 14.4 | 9.0 | 5.0 | 3.2 | 1.6 | 7.8 | 0.5 | 0.9 |
| D | 1000 | 2.13 | 1.7 | 3.3 | 1.3 | 2.6 | 0.2 | 0.5 | 2.8 | 0.0 | 0.0 |
| E | 500 | 10.60 | 0.5 | 1.6 | 0.1 | 0.6 | 0.5 | 0.2 | 0.6 | 0.0 | 0.0 |
| F | 1000 | 21.28 | 0.4 | 0.2 | 0.0 | 0.1 | 0.0 | 0.3 | 0.6 | 0.0 | 0.0 |

[a] $V_1-V_2$ in FIG. 1

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

I claim:

1. A method of preparing an electromagnetic shielding composite which exhibits high conductivity and low resistance comprising:
   providing a composite comprising an electrically conductive material dispersed within a matrix material; and
   applying an electrical potential difference across said composite of sufficient magnitude to increase the conductivity of the composite whereby an additional application of said electrical potential difference will not further increase the conductivity of the composite, and thereafter passing an electrical current through the composite of sufficient magnitude to further increase the conductivity of the composite while maintaining the electrical potential difference at a value which does not exceed the value of the electrical potential difference which was previously applied, said electrical current being of a value greater than the value of any current which previously passed through the composite during application of said electrical potential difference.

2. The method of claim 1 wherein the matrix material is selected from the group consisting of thermoplastic or thermosetting materials.

3. The method of claim 1 wherein the matrix material comprises a foamed material.

4. The method of claim 2 wherein the matrix material is a thermoplastic material.

5. The method of claim 4 wherein the matrix material is selected from the group consisting of polyethylene, polystyrene and polycarbonate.

6. The method of claim 1 wherein the electrically conductive material comprises carbon fibers.

7. The method of claim 1 wherein the electrically conductive material is selected from the group consisting of metallic solids and metallized non-conductive solids.

8. The method of claim 7 wherein the electrically conductive material comprises metallic solids which are comprised of a material selectd from the group consisting of copper, zinc, aluminum, silver, iron, nickel, gold, tungsten, niobium, carbon steel, stainless steel and mixtures thereof.

9. The method of claim 1 wherein the conductive material is dispersed within the matrix material in an amount ranging from about 5 to about 60 percent by weight based on the weight of the composite.

10. The method of claim 9 wherein the conductive material is present in an amount ranging from about 5 to 40 percent by weight based on the weight of the composite.

11. The method of claim 9 wherein the conductive material is present in a amount ranging from about 15 to 30 percent by weight based on the weight of the composite.

12. The method of claim 1 wherein the electrical potential difference which is applied ranges from about 500 to 15,000 volts.

13. The method of claim 1 wherein the electrical current which is passed through the composite ranges from about 100 microamps to about 100 milliamps.

14. The method of claim 1 wherein a first and at least one additional electrical current of differing magnitudes are passed through the composite and wherein the magnitude of said at least one additional electrical current is greater than the magnitude of said first electrical current.

15. A method of preparing an electromagnetic radiation shielding composite which exhibits high conductivity and low resistance comprising:
providing a composite comprising an electrically conductive material dispersed within a matrix material; and
applying an electrical potential difference across said composite such that a first and at least one additional electrical potential difference are applied across said composite, each said potential difference being greater than the potential difference which precedes it and each said additional potential difference which is applied being of such a value so as to increase the conductivity of said composite in comparison to that which said composite exhibits prior to applying said additional electrical potential difference, said electrical potential differences being applied a sufficient number of times and increased to such a value so that the conductivity of the composite no longer increases, thereafter passing an electrical current through the composite of sufficient magnitude to further increase the conductivity of the composite while maintaining the electrical potential difference at a value which does not exceed the value of the highest electrical potential difference previously applied, said electrical current being of a value greater than the value of any current which previously passed through the composite during application of said electrical potential difference.

16. The method of claim 15 wherein the matrix material is selected from the group consisting of thermoplastic or thermosetting materials.

17. The method of claim 15 wherein the matrix material comprises a foamed material.

18. The method of claim 16 wherein the matrix material is thermoplastic material.

19. The method of claim 18 wherein the matrix material is selected from the group consisting of polyethylene, polystyrene and polycarbonate.

20. The method of claim 15 wherein the electrically conductive material comprises carbon fibers.

21. The method of claim 15 wherein the electrically conductive material is selected from the group consisting of metallic solids and metallized non-conductive solids.

22. The method of claim 21 wherein the electrically conductive material comprises metallic solids which are comprised of a material selected from the group consisting of copper, zinc, aluminum, silver, iron, nickel, gold, tungsten, niobium, carbon steel, stainless steel and mixtures thereof.

23. The method of claim 15 wherein the conductive material is dispersed whithin the matrix material in an amount ranging from about 5 to 60 percent by weight based on the weight of the composite.

24. The method of claim 23 wherein the conductive material is present in an amount ranging from about 5 to 40 percent by weight based on the weight of the composite.

25. The method of claim 23 wherein the conductive material is present in an amount ranging from about 15 to 30 percent by weight based on the weight of the composite.

26. The method of claim 15 wherein the electrical potential difference which is applied ranges from about 500 to 15,000 volts.

27. The method of claim 15 wherein from two to ten electrical potential differences of differing magnitudes are applied.

28. The method of claim 27 wherein from three to six electrical potential differences of differing magnitudes are applied.

29. The method of claim 15 wherein the value of said at least one additional electrical potential difference exceeds the value of the electrical potential difference which precedes it by about 25 to 300 percent.

30. The method of claim 15 wherein the values of the electrical potential differences which are applied are increased intermittently.

31. The method of claim 15 wherein the values of the electrical potential differences which are applied are increased continuously.

32. The method of claim 15 wherein a first and at least one additional electrical current of differing magnitudes are passed through the composite and wherein the magnitude of said at least one additional electrical current is greater than the magnitude of said first electrical current.

33. The method of claim 15 wherein the electrical current which is passed through the composite ranges from about 100 microamps to about 100 milliamps.

34. The method of claim 3 wherein the foamed matrix material exhibits a density in excess of 70 percent of the density exhibited by said matrix material in an unfoamed state.

35. The method of claim 17 wherein the foamed matrix material exhibits a density in excess of 70 percent of the density exhibited by said matrix material in an unfoamed state.

36. The method of claim 1 wherein said electrical potential difference is of a magnitude such that the composite is not physically degraded by application thereof and the conductivity of the composite cannot be increased further by application of an electrical potential difference of greater magnitude.

37. The method of claim 15 wherein the highest electrical potential difference which is applied is of a magnitude such that the composite is not physically degraded by application thereof and the conductivity of the composite cannot be increased further by application of an electrical potential difference of greater magnitude.

38. The method of claim 1 wherein said electrical current is of sufficient magnitude such that it exceeds the magnitude of any electrical current previously passed through the composite during the application of said electrical potential difference.

39. The method of claim 15 wherein said electrical current is of sufficient magnitude such that it exceeds the magnitude of any electrical current previously passed through the composite during application of said first and said at least one additional electrical potential difference.

* * * * *